(12) United States Patent
Polyak et al.

(10) Patent No.: US 9,022,715 B2
(45) Date of Patent: May 5, 2015

(54) LOAD LOCK CHAMBER DESIGNS FOR HIGH-THROUGHPUT PROCESSING SYSTEM

(71) Applicant: Applied Materials, Inc., Santa Clara, CA (US)

(72) Inventors: Alexander S. Polyak, San Jose, CA (US); James L'Heureux, Santa Clara, CA (US); Christopher T. Lane, San Jose, CA (US); Susanne Schlaefer, Weinolsheim (DE); Juergen Henrich, Limeshain (DE); Josef Thomas Hoog, El Granada, CA (US); Calvin R. Augason, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/029,307

(22) Filed: Sep. 17, 2013

(65) Prior Publication Data

US 2014/0079514 A1    Mar. 20, 2014

Related U.S. Application Data

(60) Provisional application No. 61/702,613, filed on Sep. 18, 2012.

(51) Int. Cl.
*B65G 53/46*    (2006.01)
*H01L 21/677*    (2006.01)
*H01L 21/67*    (2006.01)

(52) U.S. Cl.
CPC ........ *H01L 21/677* (2013.01); *H01L 21/67201* (2013.01)

(58) Field of Classification Search
CPC .. C23C 14/56; H01L 21/67201; H01L 21/677
USPC .......... 414/219, 220, 222.11, 223.01, 331.05; 271/315
See application file for complete search history.

(56) References Cited

U.S. PATENT DOCUMENTS

| | | | |
|---|---|---|---|
| 5,277,413 A * | 1/1994 | Boss ............................ | 270/52.3 |
| 6,196,154 B1 | 3/2001 | Baumecker et al. | |
| 6,520,318 B1 | 2/2003 | Humele | |
| 7,513,953 B1 | 4/2009 | Felts | |
| 8,534,976 B2 * | 9/2013 | Gertmann et al. ............ | 414/217 |
| 2003/0232150 A1 * | 12/2003 | Arnold et al. ................. | 427/569 |
| 2006/0027450 A1 | 2/2006 | Hegemann et al. | |
| 2012/0129325 A1 | 5/2012 | Adibi et al. | |
| 2012/0148374 A1 | 6/2012 | van der Meulen | |

FOREIGN PATENT DOCUMENTS

EP    1624086 A1    2/2006

* cited by examiner

*Primary Examiner* — Saul Rodriguez
*Assistant Examiner* — Mark Hageman
(74) *Attorney, Agent, or Firm* — Patterson & Sheridan, LLP

(57) ABSTRACT

Methods and apparatus for transferring one or more substrates from a first pressure environment to a second pressure environment is provided. In one embodiment, a load lock chamber is provided. The load lock chamber comprises a first circular housing, and a second circular housing disposed within and movable relative to the first circular housing, one of the first circular housing or the second circular housing comprising a plurality of discrete regions, wherein at least a portion of the plurality of discrete regions are in selective fluid communication with one of at least two vacuum pumps based on the angular position of the second circular housing relative to the first circular housing.

12 Claims, 9 Drawing Sheets

LOAD LOCK CHAMBER DESIGNS FOR HIGH-THROUGHPUT PROCESSING SYSTEM

CROSS REFERENCE TO RELATED APPLICATIONS

This application claims benefit of U.S. Provisional Patent Application Ser. No. 61/702,613, filed Sep. 18, 2012, which is hereby incorporated by reference herein.

BACKGROUND OF THE INVENTION

1. Field of the Invention

Embodiments of the present invention generally relate to a dynamic load lock chamber that is adapted to transfer one or more substrates from a first region that is at first pressure to a second region that is at a second pressure different than the first pressure.

2. Description of the Related Art

There is an ongoing demand for photovoltaic (PV) devices or solar cells to generate electrical power with higher efficiency. PV devices are typically formed on a thin, fragile substrate, which typically comprises silicon, although other substrate materials may be used. As the demand for PV devices continues to grow, there is a trend to reduce cost by increasing the substrate throughput and improving the quality of the deposition processes performed on the substrate. In order to meet these challenges, the following solar cell processing requirements generally need to be met: 1) the cost of ownership (CoO) for substrate fabrication equipment needs to be improved (e.g., high system throughput, high machine up-time, inexpensive machines, inexpensive consumable costs), 2) the area processed per process cycle needs to be increased (e.g., reduce processing per Watt-peak (Wp)) and 3) the quality of the formed layers and film stack formation processes needs to be well controlled and sufficient to produce highly efficient solar cells.

An issue with thin substrates, in particular thin silicon substrates used for solar cells, is enabling high throughput processing while minimizing the breakage thereof. These very thin silicon substrates are also subject to chipping or fracture if they are impacted against an object, and once they are chipped or broken, they cannot be used for solar cell production. Because solar cell production typically includes multiple deposition, printing and annealing steps which are undertaken in multiple independent processing tools, the cost of damaging a substrate increases at each stage in the fabrication process.

One challenge in this regard involves introduction of these substrates from an ambient pressure environment (typically at or near atmospheric pressure) into a low pressure processing environment. Traditionally, this involves moving a batch of substrates through a first slit valve opening, from an environment at ambient pressure into a load lock chamber, which is coupled to, but sealed from, a low pressure processing environment using a second slit valve. The load lock chamber is then sealed from the atmospheric pressure environment using the first slit valve. The pressure is then slowly reduced within the chamber to become at or near that in the processing chamber to prevent unintended, and undesirable, movement of the low mass, fragile substrates which would occur if air currents are produced in the load lock chamber during this pumpdown process. The substrates are then moved into the processing chamber through the second slit valve opening in the load lock chamber. The second slit valve is then closed and the load lock chamber is vented so that it can then receive the next batch of substrates.

However, this traditional load lock transfer process is time intensive and limits the processing capabilities of the entire production line, and thus, increases the cost of producing PV devices. To reduce this cost, while also reducing surface contamination, there is a need for a design of an inventive load lock chamber and process that enables high throughput, improved device yield, reduced number of substrate handling steps, and a compact system footprint.

SUMMARY OF THE INVENTION

In one embodiment, a load lock chamber is provided. The load lock chamber comprises a first circular housing, and a second circular housing disposed within and movable relative to the first circular housing, the second circular housing comprising a conveyor, wherein one of the first circular housing or the second circular housing comprises a plurality of discrete regions, and wherein at least a portion of the plurality of discrete regions are in selective fluid communication with one of at least two vacuum pumps based on the angular position of the second circular housing relative to the first circular housing.

In another embodiment, a load lock chamber is provided. The load lock chamber includes a first stationary housing having a plurality of vacuum pumps coupled thereto to form a respective variable pressure region within the chamber, and a second movable housing disposed within the first stationary housing, the second circular housing comprising a conveyor, wherein one of the first stationary housing or the second movable housing comprises a plurality of discrete regions, and wherein at least a portion of the plurality of discrete regions are in selective fluid communication with one of the plurality of vacuum pumps based on the angular position of the second movable housing relative to the first stationary housing.

In another embodiment, a method for transferring a plurality of substrates is provided. The method includes transferring at least one substrate through a first opening in a first housing to a second housing at a first pressure, the second housing comprising a conveyor, moving the substrate in the second housing along a circular path to be in fluid communication with at least one discrete region along the circular path having a second pressure lower than the first pressure, transferring the substrate through a second opening in the first housing to an environment having a pressure equal to or less than the second pressure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally includes a dynamic load lock chamber that may be disposed within a production line, for example, a solar cell production line, for processing a film stack on substrates used to form regions of a photovoltaic (PV) device. Substrates, such as solar cell substrates for forming PV devices, may be disposed singularly or in an array and may be transferred between two distinct pressure environments within the dynamic load lock chamber. The substrates as described herein may comprise substrates made of glass, silicon, ceramics, or other suitable substrate material. Within the dynamic load lock chamber, the substrate(s) is exposed to staged changes in pressure during transfer through the dynamic load lock chamber.

Figure 1:
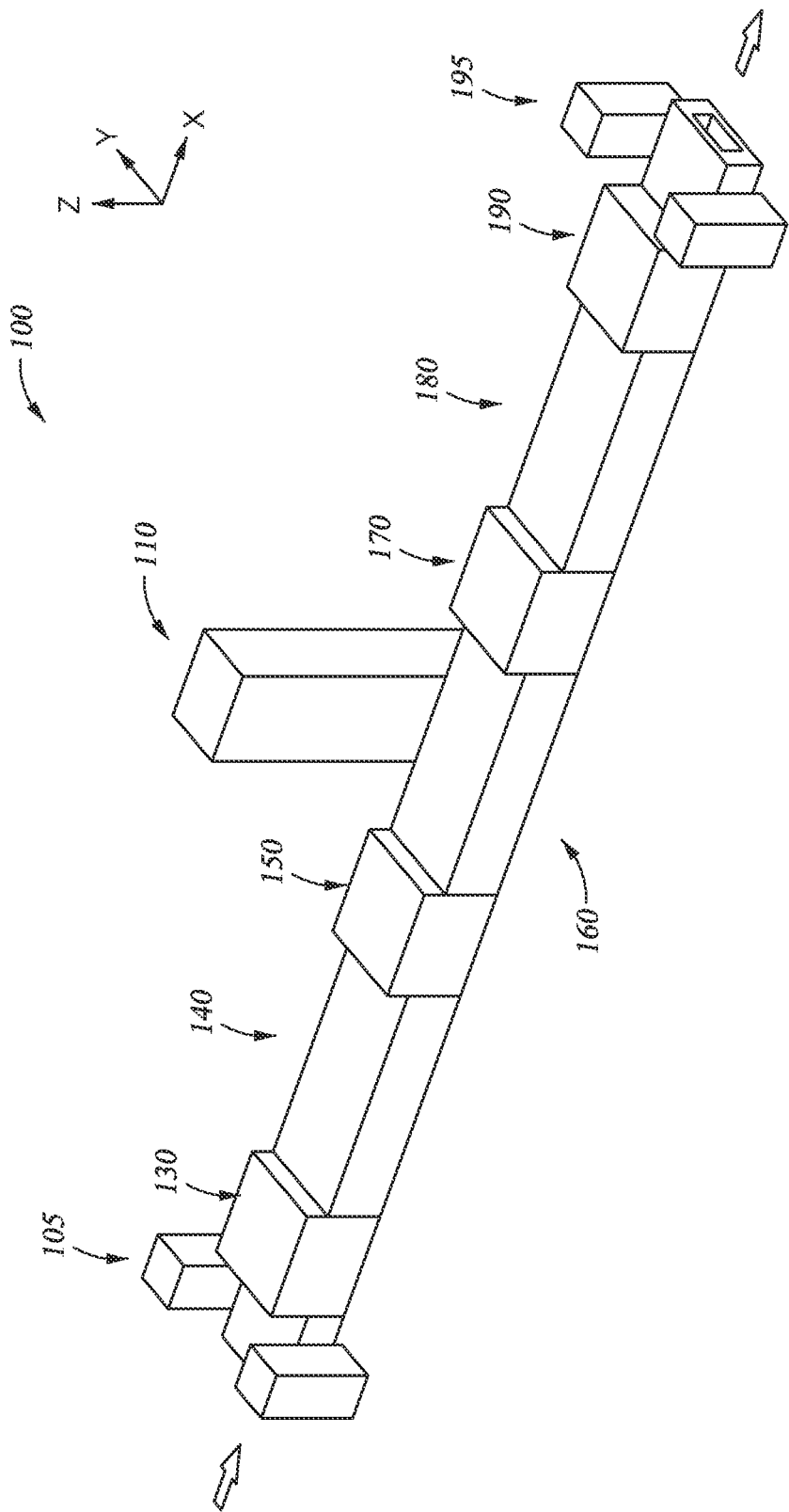
FIG. 1 is a perspective view illustrating a substrate processing system according to embodiments described herein.

FIG. 1 is a perspective view illustrating a substrate processing system 100 for performing one or more solar cell fabrication processes on a linear array of substrates according to an embodiment of the present invention. The substrate processing system 100 may include a substrate loading station 105, a first dynamic load lock chamber 130, one or more processing chambers 140, 150, 170 and 180, a second dynamic load lock chamber 160, a third dynamic load lock chamber 190, and a substrate unload chamber 195. Control of systems and subsystems of the substrate processing system 100 may be provided by a system controller 110.

Collectively, the one or more processing chambers 140, 150, 170 and 180 may include one of the following types of chambers: PECVD chambers, LPCVD chambers, hot wire chemical vapor deposition (HWCVD) chambers, ion implant/doping chambers, plasma nitridation chambers, atomic layer deposition (ALD) chambers, physical vapor deposition (PVD) or sputtering chambers, plasma or vapor chemical etching chambers, and thermal processing chambers (e.g., RTA or RTO, or cool-down chambers). In one embodiment, the one or more processing chambers may include a first processing chamber 140 for heating substrates, a second processing chamber 150 for depositing materials on substrates, a third processing chamber 170 for depositing materials on substrates, and a fourth processing chamber 180 that may cool substrates. The first dynamic load lock chamber 130 facilitates transfer of substrates between the substrate loading station 105 and the one or more processing chambers 140 and 150. The second dynamic load lock chamber 160 facilitates transfer of substrates between the one or more processing chambers 150 and 170. The third dynamic load lock chamber 190 facilitates transfer of substrates between the processing chambers 170 and 180 and the substrate unload chamber 195.

One or more of the chambers 130, 140, 150, 160, 170, 180 and 190 may be cycled between a first pressure environment, such as ambient pressure (e.g., at or near atmospheric pressure) to a second pressure environment, such as vacuum pressures (e.g., about 1-100 milliTorr (about 1.33 deciPascals to about 13.33 Pascals)). At least the first dynamic load lock chamber 130 facilitates transfer of substrates from the first pressure environment to the second pressure environment, while the third dynamic load lock chamber 190 may facilitate transfer of substrates from the second pressure environment to the first pressure environment. The second dynamic load lock chamber 160 may be configured to transfer substrates between a first pressure environment within the processing chamber 150 and a second pressure environment within the processing chamber 170, wherein both of the first and second pressure environments may be at different negative pressures. One or more of the first dynamic load lock chamber 130, the second dynamic load lock chamber 160, and the third dynamic load lock chamber 190 may be configured to provide a staged pressure environment as substrates are transferred therein or therethrough. One or more of the first dynamic load lock chamber 130, the second dynamic load lock chamber 160, and the third dynamic load lock chamber 190 may also be configured as a substrate re-orientation chamber (e.g., a flipping chamber).

Figure 2A:
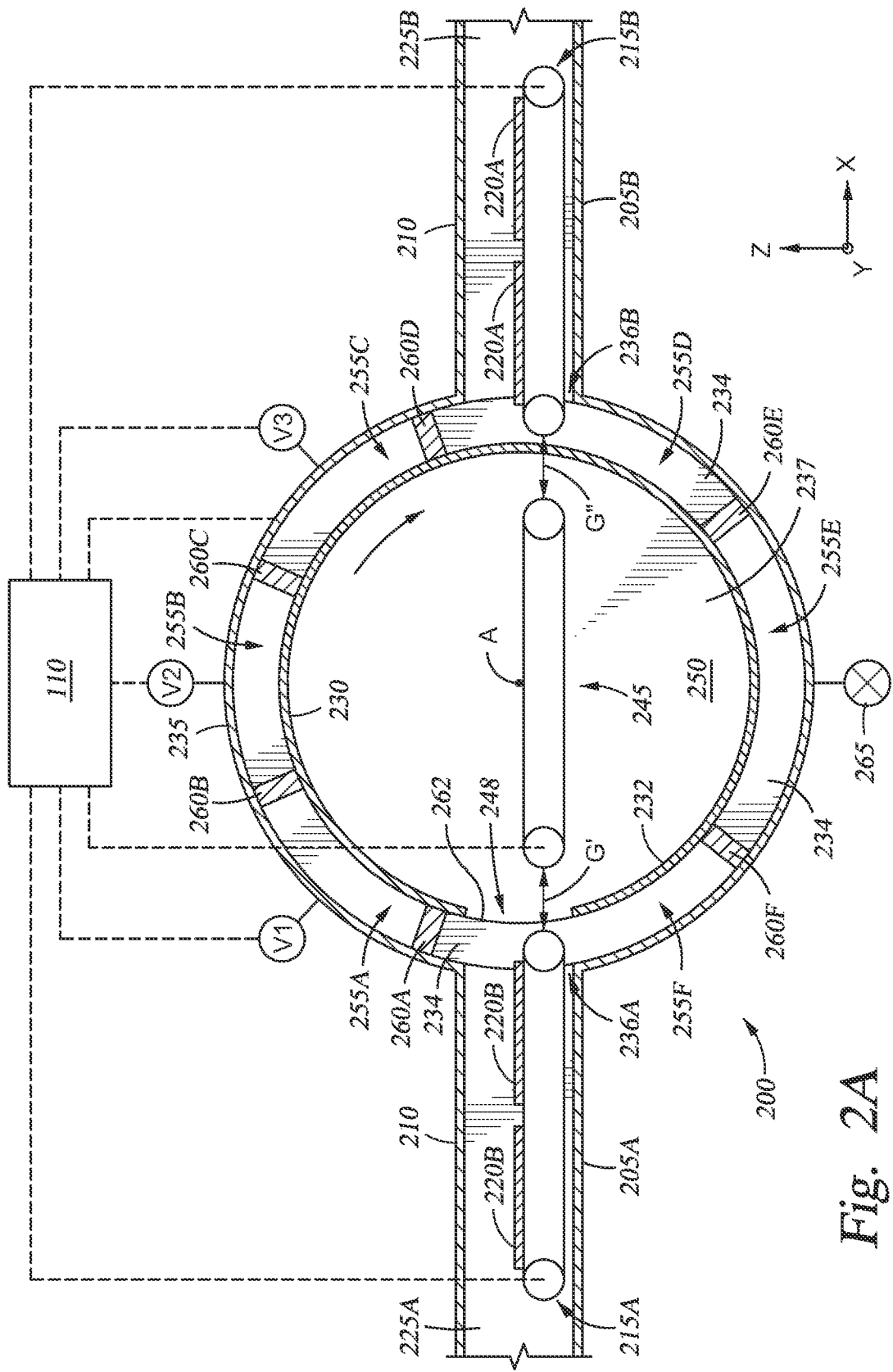
FIGS. 2A-2C are a schematic cross-sectional side views of one embodiment of a dynamic load lock chamber that may be part of the substrate processing system of FIG. 1.
Figure 2B:
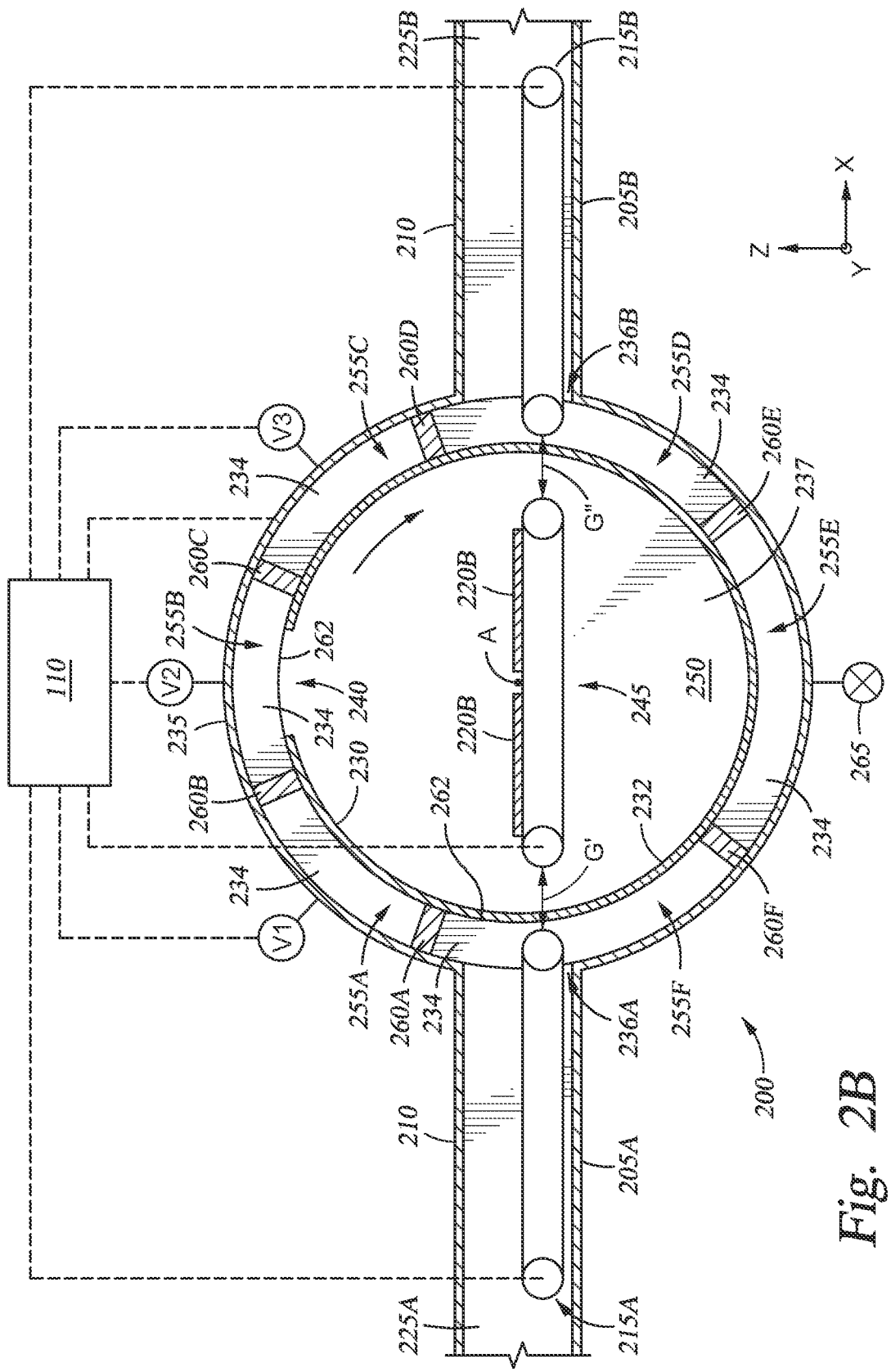
Figure 2C:
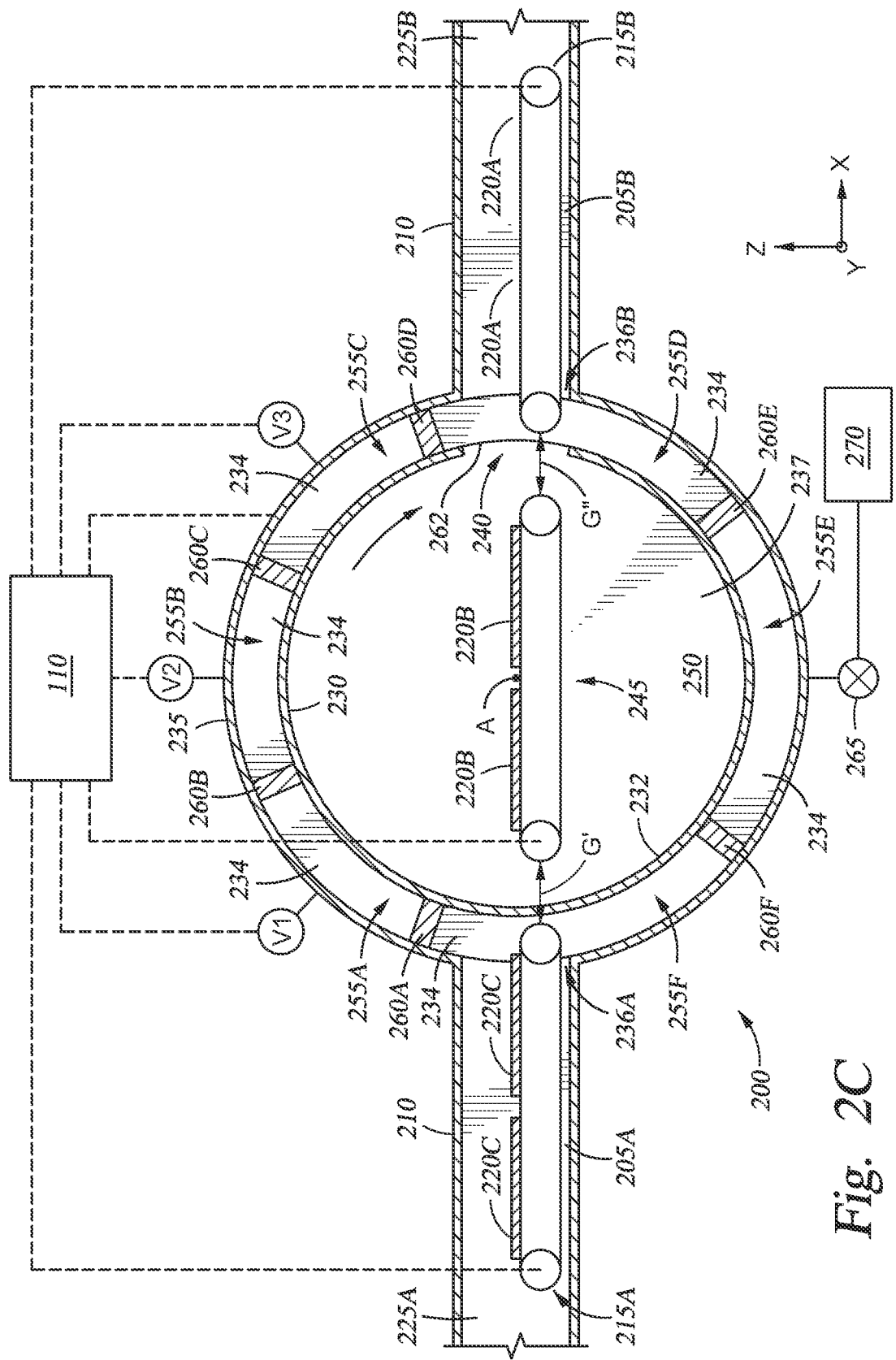

FIGS. 2A-2C are a schematic cross-sectional side views of one embodiment of a dynamic load lock chamber 200 that may be part of the substrate processing system 100 of FIG. 1. In this embodiment, a dynamic load lock chamber 200 is positioned intermediate of a first chamber 205A and a second chamber 205B. The dynamic load lock chamber 200, as well as the first chamber 205A and the second chamber 205B may be part of the substrate processing system 100 of FIG. 1. The dynamic load lock chamber 200 may be utilized as one or more of the first dynamic load lock chamber 130, the second dynamic load lock chamber 160, and the third dynamic load lock chamber 190 of the substrate processing system 100 of FIG. 1. The first chamber 205A and the second chamber 205B may be utilized as one or more of the processing chambers 140, 150, 170 and 180 of the substrate processing system 100. Alternatively, one of the first chamber 205A and the second chamber 205B may be utilized as the substrate loading station 105 or the substrate unload chamber 195 of the substrate processing system 100 of FIG. 1.

Each of the first chamber 205A and the second chamber 205B include a housing 210 and a conveyor system, such as a first conveyor 215A and a second conveyor 215B, respectively, that supports and transfers substrates 220A-220C (substrates 220C are shown in FIG. 2C) within each housing 210 as well as to and from the dynamic load lock chamber 200. Each housing 210 defines an interior volume 225A, 225B that contains a first pressure region and a second pressure region that may be different than the first pressure region. The dynamic load lock chamber 200 provides a staged pressure interface between the first pressure region and the second pressure region.

The dynamic load lock chamber 200 comprises a first housing, such as a stationary housing 235 that is stationary relative to a second housing, such as a rotating drum 230, which is movable relative to the first housing. In this embodiment, the dynamic load lock chamber 200 comprises the rotating drum 230 disposed within the stationary housing 235. The stationary housing 235 is coupled to each of the first chamber 205A and the second chamber 205B adjacent a first opening 236A and an opposing second opening 236B, respectively, in a sidewall of the stationary housing 235. The rotating drum 230 rotates about an axis A based on instructions from the controller 110. In this embodiment, the rotating drum 230 rotates about axis A in a clockwise direction. The rotating drum 230 includes an opening 240 formed in a circular sidewall 232 that moves to different radial positions relative to the stationary housing 235 corresponding with movement of the rotating drum 230 about axis A. In FIG. 2A, the rotating drum 230 is rotated such that the opening 240 is aligned with, i.e., centered about, the longitudinal axis of the first chamber 205A. The stationary housing 235 also includes circular end plates or sidewalls 234 (only one is shown in the cross-sectional view of FIG. 2A) which extend inwardly towards the circular sidewall 232 of the rotating drum 230. Likewise, the rotating drum 230 includes circular end plates or sidewalls 237 (only one is shown in the cross-sectional view of FIG. 2A) which forms a portion of an internal volume 250 within the rotating drum 230.

When the rotating drum 230 is in the position shown in FIG. 2A, the first conveyor 215A may be actuated to transfer substrates 220B into the opening 240 of the rotating drum 230 by rotating one or more rollers to move a continuous drive member, such as a belt or chain, positioned thereover, based on instructions from the controller 110. Actuation of the first conveyor 215A moves one or more substrates 220B in the X direction across a gap G' to a substrate support 245 disposed in the internal volume 250 within the rotating drum 230. The substrate support 245 may comprise a conveyor that receives the one or more substrates 220B and selectively moves the substrates 220B in at least the X direction within the rotating drum 230 based on instructions from the controller 110. The substrate support 245 may be a roller arrangement having a continuous drive member, such as a belt or chain thereover, and movement of the continuous drive member is synchronized with movement of the continuous drive member of the first conveyor 215A to pass a substrate from the first conveyor 215A to the substrate support 245.

FIG. 2B shows the rotating drum 230 having been rotated within the stationary housing 235 to about the 12 o'clock position with the substrates 220B located on the substrate support 245 therein. The substrates 220B are shown in a stationary position on the substrate support 245 within the rotating drum 230. In the 12 o'clock position, the opening 240 is in fluid communication with a variable pressure region 255B. The dynamic load lock chamber 200 includes a plurality of variable pressure regions 255A-255F formed between an outer surface of the rotating drum 230 and an inner surface of the stationary housing 235. Each of the variable pressure regions 255A-255F are bounded by vacuum seals 260A-260F and 262. The vacuum seal 262 may be coupled to one of the circular sidewall 232 of the rotating drum 230 and the sidewalls 237 to be in sliding contact therebetween in order to isolate pressure therein. For example, the vacuum seal 262 may be coupled to the sidewalls 237 at a radius of the circular sidewall 232 of the rotating drum 230 to be in sliding communication with the circular sidewall 232 of the rotating drum 230.

A portion of the variable pressure regions 255A-255F are coupled to first-third vacuum pumps V1-V3, each having a different pressure rating for providing a different negative pressure in each of the variable pressure regions 255A-255F. Each of the vacuum seals 260A-260F and 262 are comprised of materials that limit outgassing while providing a vacuum seal via sliding contact with the outer surface of the rotating drum 230. Each of the vacuum seals 260A-260F and 262 may be a spring-loaded polymeric sealing element, a sliding foil seal, or combinations thereof.

In one embodiment, the vacuum seals 260A-260F and 262 may be manufactured from a suitable polymer material, such as a self lubricating polymer, to provide low sliding resistance and reduce the possibility of contamination when the vacuum seals 260A-260F and 262 are in contact with the rotating drum 230. One example of a polymer material that may be used in the vacuum seals 325, 262 is ORIGINAL MATERIAL "S"® 8000 manufactured by Murtfeldt Kunststoffe GmbH & Co. KG of Dortmund, Germany. Alternatively, the vacuum seals 260A-260F and 262 may be manufactured using other materials, such as a metallic material (e.g., stainless steel, aluminum) or graphite. The vacuum seals 260A-260F and 262 may be movably disposed in a housing that mounts to the stationary housing 235 and the inside surface of the circular sidewalls 237. A compression member may be disposed within the housing to provide compressive force to bias the vacuum seals 260A-260F and 262 toward the surfaces of the rotating drum 230. Alternatively, the compression member may include magnetic, hydraulic, or pneumatic actuators that bias the vacuum seals 260A-260F and 262 toward the surfaces of the rotating drum 230.

As the rotating drum 230 is rotated from the position shown in FIG. 2A to the position shown in FIG. 2B, the opening 240 comes into fluid communication with the variable pressure region 255A and the first vacuum pump V1. The opening 240 is utilized as a conductance path to provide a first lower pressure to the interior volume 250 of the rotating drum 230. The first lower pressure is lower than the first pressure of the interior volume 225A of the first chamber 205A but higher than the second pressure in the interior volume 225B of the second chamber 205B. As the rotating drum 230 continues to rotate, it will position the opening 240 to move past a first vacuum seal 260B that effectively impedes conductance between the interior volume 250 of the rotating drum 230 and the variable pressure region 255A. As the opening 240 passes the first vacuum seal 260B, the opening 240 is in fluid communication with the variable pressure region 255B and the second vacuum pump V2, as shown in FIG. 2B. The opening 240 is utilized as a conductance path to provide a second lower pressure to the interior volume 250 of the rotating drum 230. The second lower pressure is lower than the first lower pressure of the variable pressure region 255A but higher than the second pressure in the interior volume 225B of the second chamber 205B. The rotating drum 230 then rotates to position the opening 240 past a second vacuum seal 260C that effectively impedes conductance between the interior volume 250 of the rotating drum 230 and the variable pressure region 255B. As the opening 240 passes the second vacuum seal 260C, the opening 240 is in fluid communication with the variable pressure region 255C and the third vacuum pump V3. The opening 240 is utilized as a conductance path to provide a third lower pressure to the interior volume 250 of the rotating drum 230. The third lower pressure is lower than the second lower pressure of the variable pressure region 255B but substantially equal to or greater than the second pressure in the interior volume 225B of the second chamber 205B. The rotating drum 230 then rotates to position the opening 240 past a third vacuum seal 260D that effectively impedes conductance between the interior volume 250 of the rotating drum 230 and the variable pressure region 255C.

As the opening 240 passes the third vacuum seal 260D, the opening 240 is in fluid communication with the variable pressure region 255D. The rotating drum 230 may be further rotated to align the opening 240 with the second opening 236B of the second chamber 205B, as shown in FIG. 2C. Depending on the pressure in the interior volume 225B of the second chamber 205B, the interior volume 250 of the rotating drum 230 may be in equilibrium. Alternatively, when the pressure in the interior volume 225B of the second chamber 205B is lower than the pressure in the interior volume 250 of the rotating drum 230, conductance may be established between the interior volume 250 of the rotating drum 230 and the interior volume 225B of the second chamber 205B such that equilibrium is provided. When the rotating drum 230 is in the position shown in FIG. 2C, the substrate support 245 and the second conveyor 215B may be actuated to transfer substrates 220B through the opening 240 of the rotating drum 230 based on instructions from the controller 110. The second conveyor 215B may be configured similarly to the first conveyor 215A. Synchronized actuation of the substrate support 245 and the second conveyor 215B moves the one or more substrates 220B in the X direction across a gap G" to the second conveyor 215B of the second chamber 205B. Subsequent substrates 220C may be positioned on the first conveyor 215A of the first chamber 205A and thus queued for transfer into the dynamic load lock chamber 200 when the rotating drum 230 is rotated to the position shown in FIG. 2A.

Returning to the position shown in FIG. 2A, the rotating drum 230 rotates to position the opening 240 between a fourth vacuum seal 260E and a fifth vacuum seal 260F to be in fluid communication with the variable pressure region 255E. The variable pressure region 255E may be maintained at a higher pressure than the second pressure of the interior volume 225B of the second chamber 205B. The variable pressure region 255E may be utilized to vent the interior volume 250 of the rotating drum 230 when the opening 240 is in fluid communication with the variable pressure region 255E. The variable pressure region 255E may include a pressure that is substantially equal to the first pressure in the interior volume 225A of the first chamber 205A. As the pressure in the interior volume 250 of the rotating drum 230 is substantially equal to the pressure in the interior volume 225B of the second chamber 205B, a valve 265 may be coupled to the variable pressure region 255E to assist in raising the pressure in the interior volume 250 of the rotating drum 230. In one embodiment, the valve 265 may be coupled with the interior volume 225A of the first chamber 205A such that when the opening 240 of the rotating drum 230 is in fluid communication with the variable pressure region 255E, equilibrium between the interior volume 225A of the first chamber 205A and the interior volume 250 of the rotating drum 230 may be provided. In an alternative embodiment, the valve 265 may be utilized to raise the pressure in the interior volume 250 of the rotating drum 230 via the variable pressure region 255E to a pressure that is slightly greater than the pressure in the interior volume 225A of the first chamber 205A. In this embodiment, the valve 265 may be coupled to a compressed fluid source 270 configured to inject a fluid into the variable pressure region 255E. The fluid may include clean dry air or, alternatively, an inert gas, such as argon or nitrogen, or mixtures thereof. The fluid may be provided at a pressure slightly above atmospheric pressure (e.g., 1,500 Pascals-10,000 Pascals above atmospheric pressure). Such an overpressure condition within the variable pressure region 255E assures that contaminants from the interior volume 225A of the first chamber 205A are not introduced into the dynamic load lock chamber 200 and consequently into a processing chamber.

While FIGS. 2A-2C show the first opening 236A of the first chamber 205A and the second opening 236B of the second chamber 205B in positions of about 9 o'clock and 3 o'clock, respectively, the positions of the first opening 236A and the second opening 236B may be different. For example, the first opening 236A may be slightly higher than the second opening 236B (in the Z direction) such that the first opening 236A may be at about the 2 o'clock position and the second opening 236B may be at about the 4 o'clock position. In this example, the transfer of substrates 220A-220C between adjacent substrate supporting surfaces in the first chamber 205A, the rotating drum 230 and the second chamber 205B, may be facilitated by gravity, alone or in combination with the movable surfaces of the first conveyor 215A, the second conveyor 215B, and/or a movable surface of the substrate support 245. The vacuum pumps V1-V3 may be positive displacement pumps, sorption pumps, cryogenic pumps, turbo-molecular pumps, or combinations thereof, in series or in parallel. The staged vacuum provided by the dynamic load lock chamber 200 may be lowering the pressure from ambient pressure (e.g., about 760 Torr (about 101.3 kiloPascals)) to about 5 milliTorr (e.g., about 0.66 Pascals) to about 10 milliTorr (e.g., about 1.33 Pascals), or less, in a half revolution of the rotating drum 230.

Figure 3A:
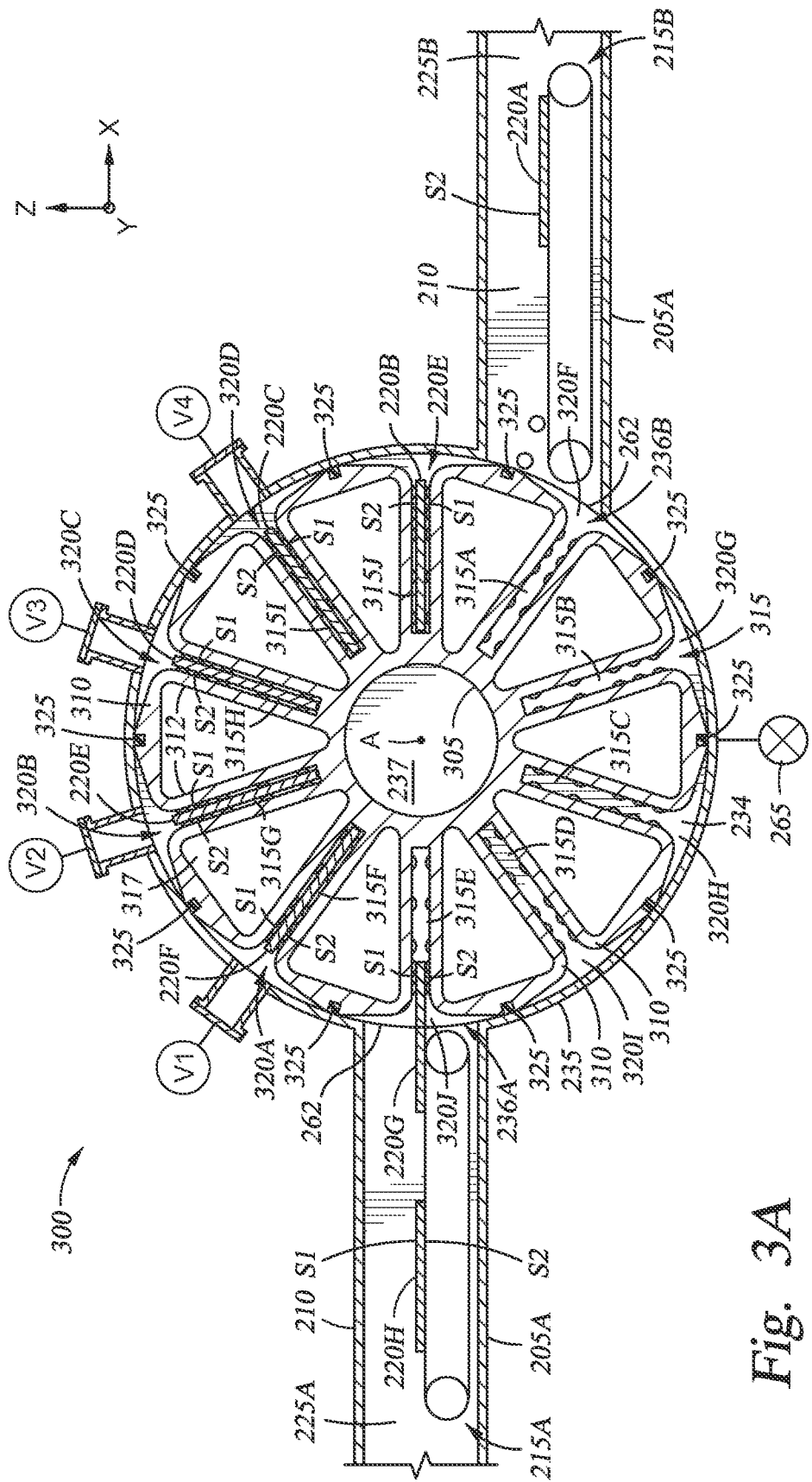
FIGS. 3A-3B are a schematic cross-sectional side views of another embodiment of a dynamic load lock chamber that may be part of the substrate processing system of FIG. 1.
Figure 3B:
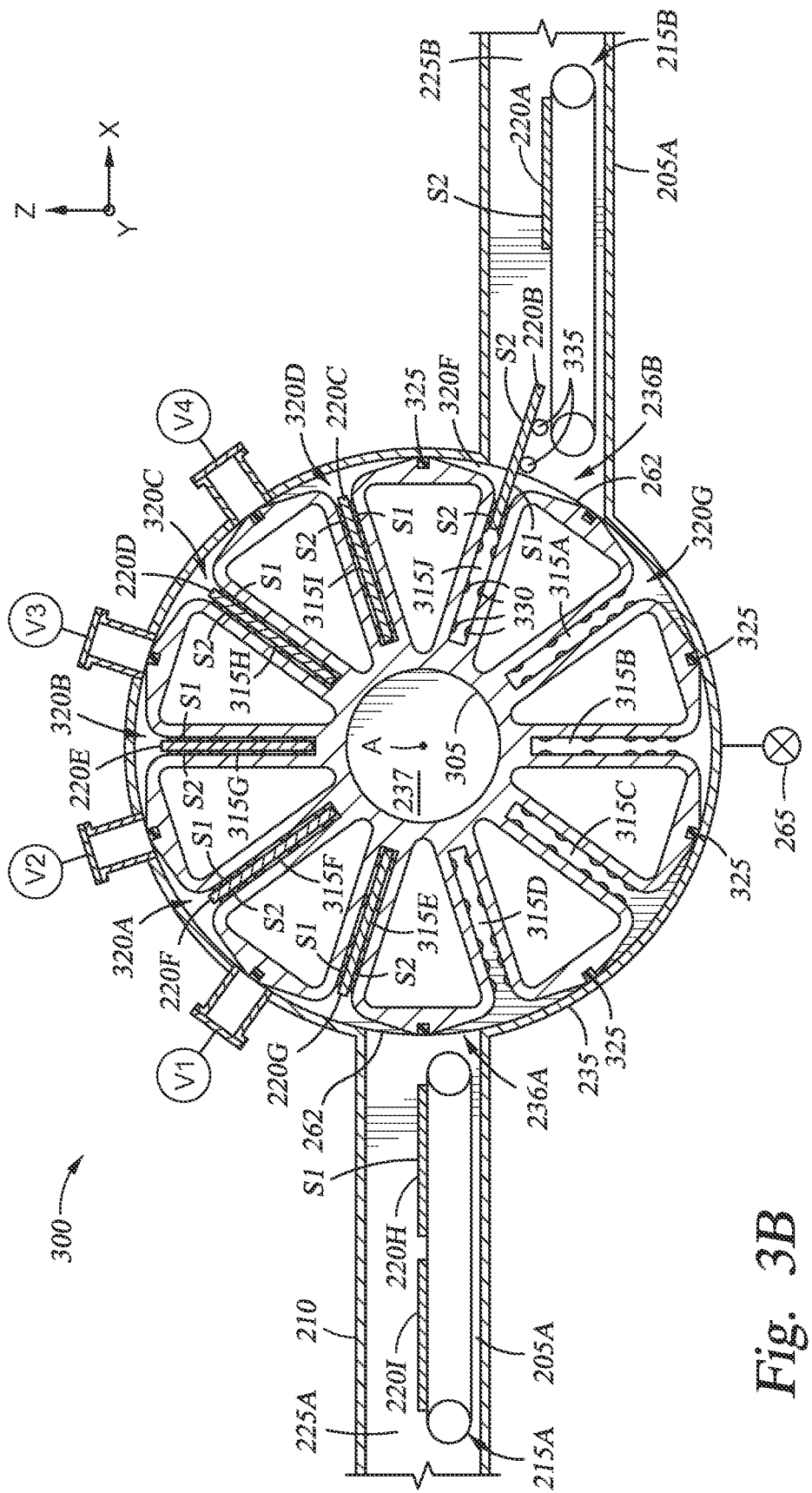

FIGS. 3A-3B are a schematic cross-sectional side views of another embodiment of a dynamic load lock chamber 300 that may be part of the substrate processing system 100 of FIG. 1. The dynamic load lock chamber 300 is positioned intermediate of a first chamber 205A and a second chamber 205B. The dynamic load lock chamber 300, as well as the first chamber 205A and the second chamber 205B may be part of the substrate processing system 100 of FIG. 1. The dynamic load lock chamber 300 may be utilized as one or more of the first dynamic load lock chamber 130, the second dynamic load lock chamber 160, and the third dynamic load lock chamber 190 of the substrate processing system 100 of FIG. 1. The first chamber 205A and the second chamber 205B may be utilized as one or more of the processing chambers 140, 150, 170 and 180 of the substrate processing system 100. Alternatively, one of the first chamber 205A and the second chamber 205B may be utilized as the substrate loading station 105 or the substrate unload chamber 195 of the substrate processing system 100 of FIG. 1.

In this embodiment, the dynamic load lock chamber 300 comprises a carousel 305 disposed within the stationary housing 235. The stationary housing 235 is coupled to each of the first chamber 205A and the second chamber 205B adjacent a first opening 236A and an opposing second opening 236B, respectively, in a sidewall of the stationary housing 235. The carousel 305 rotates about an axis A based on instructions from the controller 110 (not shown). In this embodiment, the carousel 305 rotates about axis A in a clockwise direction. The carousel 305 includes a plurality of partitions 310 that rotate about axis A. Each of the plurality of partitions 310 include a sidewall 312 having a slot 315A-315J formed therein that is adapted to receive a substrate. Each of the plurality of partitions 310 may also include a void 317. In one aspect, each of the plurality of partitions 310 are sized to take up space within the carousel 305 to reduce the volume of the dynamic load lock chamber 300.

Each of the slots 315A-315J are generally aligned with a radius of axis A, and are positionable to align with a transfer plane of each of the conveyors 215A, 215B of the first chamber 205A and the second chamber 205B, respectively, by rotation of the carousel 305 about axis A. In the view shown in FIG. 3A, slot 315E is aligned with the transfer plane of the conveyor 215A of the first chamber 205A and a substrate 220G is in-transfer into the slot 315E. Substrate 220A has been previously transferred from slot 315A to conveyor 215B of the second chamber 205B. Thus, substrates 220B-220F have been previously transferred into respective slots 315J, 315I, 315H, 315G and 315F. The dynamic load lock chamber 300 includes a plurality of variable pressure regions 320A-320J that are similar to the variable pressure regions 255A-255F of FIGS. 2A-2C. In this embodiment, each of the substrates 220B-220F are moved about axis A within the stationary housing 235 and are exposed to variable pressure regions 320A-320D along the circular path from opening 236A to opening 236B.

Each of the variable pressure regions 320A-320J are formed by the partitions 310, the circular sidewalls 234 (only one is shown in this view) and vacuum seals 325, 262 coupled to the partitions 310 and the circular sidewalls 234 and/or an inner surface of the stationary housing 235 to be in contact with the circular sidewalls 234. The vacuum seals 325 may be rotatable with the carousel 305 and are in sliding contact with an inside surface of the stationary housing 235. The vacuum seal 262 may be rotatable with the carousel 305 (i.e., on the circular sidewalls 234) or be coupled to the stationary housing 235 at a location adjacent the perimeter of the circular sidewalls 234. Each of the variable pressure regions 320A-320D are coupled to first-fourth vacuum pumps V1-V4, each having a different pressure rating for providing a different negative pressure in each of the variable pressure regions 320A-320D. Each of the vacuum seals 325 and 262 are comprised of materials that limit outgassing while providing a vacuum seal via sliding contact with the inside surface of the stationary housing 235. Each of the vacuum seals 260A-260F and 262 may be a spring-loaded polymeric sealing element, a sliding foil seal, or combinations thereof.

Thus, each substrate disposed in the dynamic load lock chamber 300 is exposed to a staged vacuum in transit from the first chamber 205A to the second chamber 205B similar to the embodiment shown in FIGS. 2A-2C (e.g., a first lower pressure less than the pressure of interior volume 225A in region 320A, a second lower pressure less than the pressure in region 320A in region 320B, a third lower pressure less than pressure in 320B in region 320C) with the addition of a fourth lower pressure in the variable pressure region 320D facilitated by the vacuum pump V4. The fourth lower pressure may be less than the third lower pressure in the variable pressure region 320C but substantially equal to or greater than the second pressure in the interior volume 225B of the second chamber 205B. Similar to the dynamic load lock chamber 200 shown in FIGS. 2A-2C, the valve 265 coupled to the stationary housing 235 may be utilized to vent variable pressure regions 320A-320J as the regions pass thereby or provide equilibrium between the regions and the interior volume 225A of the first chamber 205A as described in FIG. 2A. The staged vacuum provided by the dynamic load lock chamber 300 may be lowering of pressure from ambient pressure (e.g., about 760 Torr (about 101.3 kiloPascals)) to about 5 milliTorr (e.g., about 0.66 Pascals) to about 10 milliTorr (e.g., about 1.33 Pascals), or less, in a half revolution of the carousel 305.

Thus, the dynamic load lock chamber 300 provides a staged vacuum similar to the dynamic load lock chamber 200 described in FIGS. 2A-2C with a few notable exceptions. A first difference of this embodiment as compared to the embodiment shown in FIGS. 2A-2C relates to the number of variable pressure regions, which in this embodiment includes ten as opposed to six in FIGS. 2A-2C. Another difference in this embodiment is the inclusion of four vacuum pumps as opposed to three in the dynamic load lock chamber 200 of FIGS. 2A-2C. Another difference is ten variable pressure regions as opposed to six in the dynamic load lock chamber 200 shown in FIGS. 2A-2C. However, the number of vacuum pumps and/or variable pressure regions shown in FIGS. 2A-3A are not limited to the number shown and may be more or less, depending on user preference, substrate size, and or the size/structure of the rotating drum 230 and/or the carousel 305. In one embodiment, one or more variable pressure regions may be formed by use of one or more vacuum pumps. Variations in pressure in the variable pressure regions may be adjusted by valving that is configured to maintain lower pressures in one variable pressure region as compared to another variable pressure region. Another notable difference between the dynamic load lock chamber 200 described in FIGS. 2A-2C relates to the substrates being rotatable within the carousel 305, which provides a "flipping" function to the dynamic load lock chamber 300. For example, each of the substrates have a first side S1 and an second opposing side S2. Each of the substrates enter the slots 315A-315J with the first side S1 up and are rotated with the carousel 305 to be transferred out of the slot 315A-315J with the second side S2 up. Thus, when substrates having a processed first side S1 and an unprocessed second side S2, the dynamic load lock chamber 300 may flip the substrates to enable processing of the second side S2. Other notable differences will be described below in FIG. 3B.

FIG. 3B is a side cross-sectional view of the dynamic load lock chamber 300 of FIG. 3A showing the dynamic load lock chamber 300 carousel 305 rotated greater than about 10-15 degrees from the position shown in FIG. 3A to illustrate substrate transfer out of the carousel 305. In this position, the slot 315J is positioned near opening 236B in the second chamber 205B. The second chamber 205B is positioned slightly lower than the axis A and enables the substrate 220B to slide out of the slot 315J onto conveyor 215B. A plurality of support elements 330 and/or 335 may be utilized to facilitate transfer of the substrate 220B out of the slot 315J onto the conveyor 215B of the second chamber 205B along this angled transfer path. The support elements 330 and/or 335 may comprise friction reducing materials (e.g., high density polymers, such as HDPE), roller elements, and combinations thereof. In one embodiment, at least a portion of the plurality of support elements 330 comprise roller elements that are coupled to a drive device (not shown) that may be selectively actuated to control movement of the substrate 220B within the carousel 305. Thus, the substrate 220B may be transferred out of the slot 315J onto the conveyor 215B utilizing gravity alone, or in combination with, movement provided by movable support elements 330. Utilization of movable support elements 330 may be beneficial when the second chamber 205B is disposed substantially coplanar with the axis A (i.e., disposed at or near the 3 o'clock position) where gravity may not be used to advantage in the transfer process.

Figure 4:
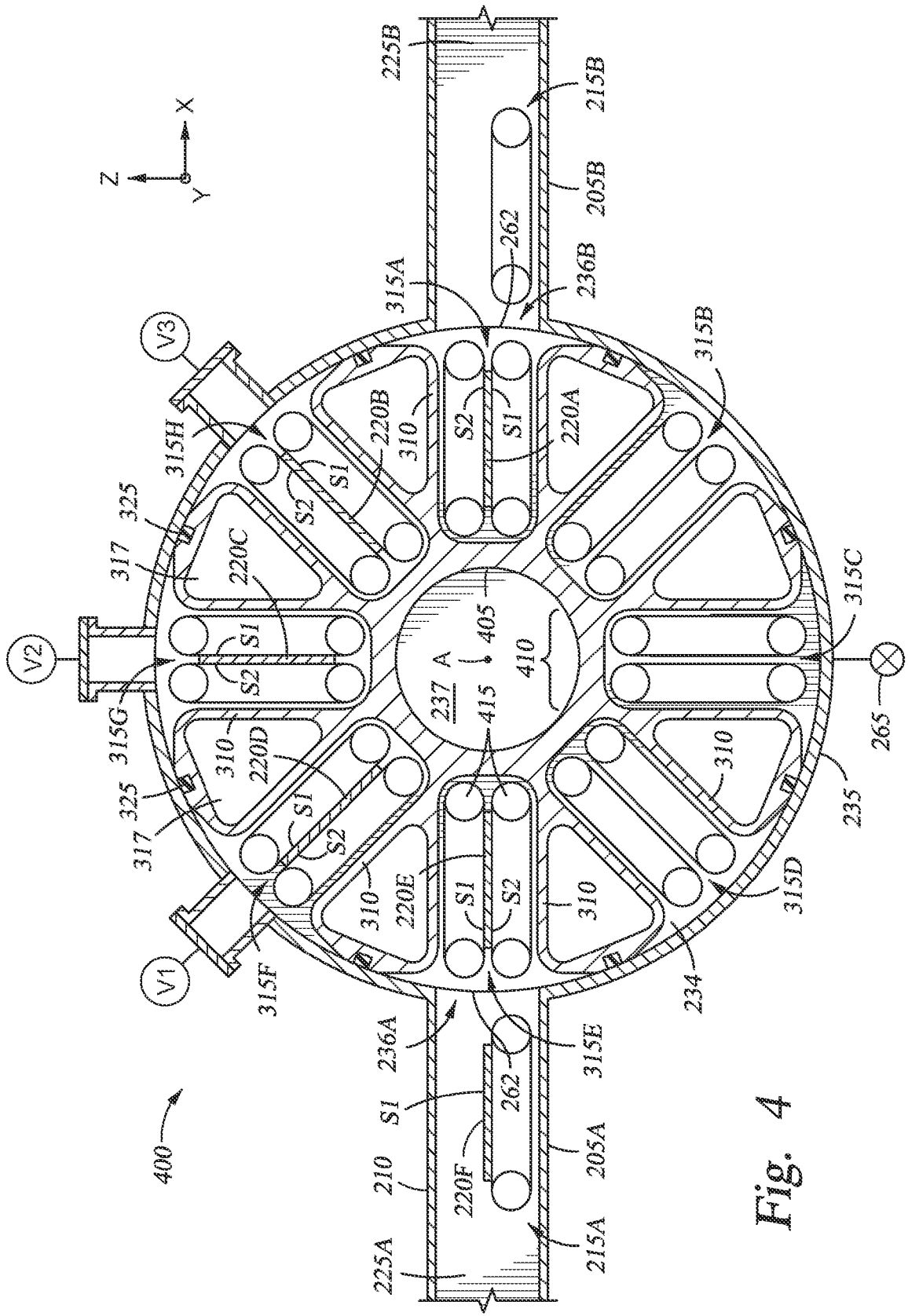
FIG. 4 is a schematic cross-sectional side view of another embodiment of a dynamic load lock chamber that may be part of the substrate processing system of FIG. 1.

FIG. 4 is a schematic cross-sectional side view of another embodiment of a dynamic load lock chamber 400 that may be part of the substrate processing system 100 of FIG. 1. The dynamic load lock chamber 400 is positioned intermediate of a first chamber 205A and a second chamber 205B. The dynamic load lock chamber 400, as well as the first chamber 205A and the second chamber 205B may be part of the substrate processing system 100 of FIG. 1. The dynamic load lock chamber 400 may be utilized as one or more of the first dynamic load lock chamber 130, the second dynamic load lock chamber 160, and the third dynamic load lock chamber 190 of the substrate processing system 100 of FIG. 1. The first chamber 205A and the second chamber 205B may be utilized as one or more of the processing chambers 140, 150, 170 and 180 of the substrate processing system 100. Alternatively, one of the first chamber 205A and the second chamber 205B may be utilized as the substrate loading station 105 or the substrate unload chamber 195 of the substrate processing system 100 of FIG. 1.

In this embodiment, the dynamic load lock chamber 400 comprises a carousel 405 disposed within the stationary housing 235. The stationary housing 235 is coupled to each of the first chamber 205A and the second chamber 205B adjacent a first opening 236A and an opposing second opening 236B, respectively, in a sidewall of the stationary housing 235. The carousel 405 rotates about an axis A similar to the embodiments of the dynamic load lock chamber 300 and the dynamic load lock chamber 200.

The dynamic load lock chamber 400 is similar to the dynamic load lock chamber 300 and the dynamic load lock chamber 200 described in FIGS. 3A and 3B, and FIGS. 2A-2C with the following exceptions. In this embodiment, each of the plurality of partitions 310 include a conveyor assembly 410 that rotates about axis A. Each of the plurality of partitions 310 include the conveyor assembly 410 comprising at least one conveyor 415. The conveyor 415 may be a roller arrangement having a continuous drive member, such as a belt or chain positioned thereover that is adapted to support a substrate. When the conveyor assembly 410 comprises two conveyors 415, each pair of conveyors 415 define a slot 315A-315H therebetween which is adapted to receive a substrate. The conveyor assembly 410 assists in transfer of substrates to and from the carousel 405. In the position shown in FIG. 4, the carousel 405 is positioned to transfer substrate 220A to conveyor 215B of the second chamber 205B. Each of the conveyor assemblies 410 may be coupled to a drive mechanism (not shown) that is selectively actuatable based on instructions from the controller 110 (shown in FIGS. 2A-2C). The conveyor assemblies 410 may be utilized to facilitate transfer of substrates by pulling incoming substrates (such as substrate 220E) through opening 236A and pushing substrates (such as substrate 220A) through opening 236B and onto the conveyor 215B of the second chamber 205B. The staged vacuum provided by the dynamic load lock chamber 400 may be lowering of pressure from ambient pressure (e.g., about 760 Torr (about 101.3 kiloPascals)) to about 5 milliTorr (e.g., about 0.66 Pascals) to about 10 milliTorr (e.g., about 1.33 Pascals), or less, in a half revolution of the carousel 405.

Figure 5:
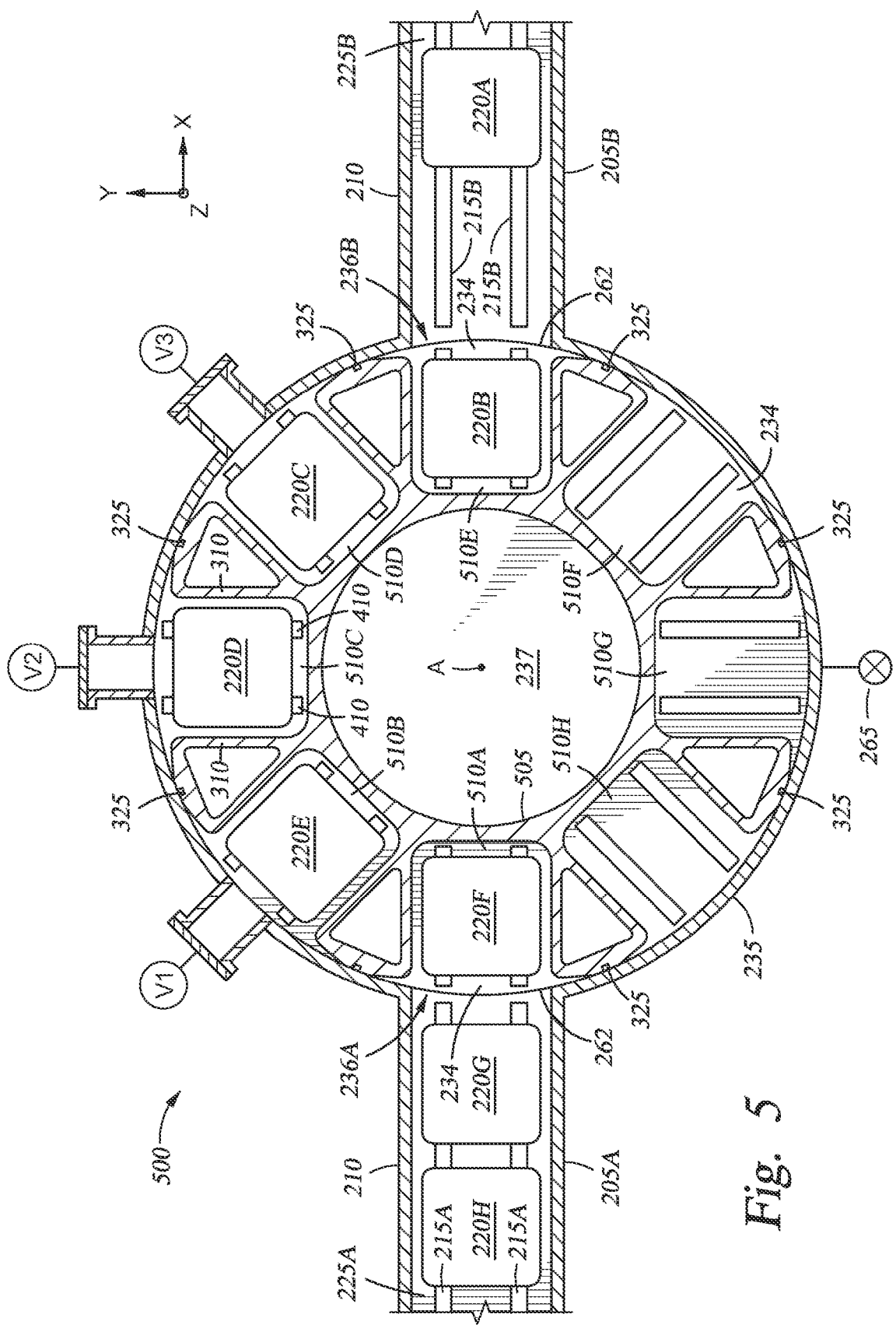
FIG. 5 is a schematic cross-sectional plan view of another embodiment of a dynamic load lock chamber that may be part of the substrate processing system of FIG. 1.

FIG. 5 is a schematic cross-sectional plan view of another embodiment of a dynamic load lock chamber 500 that may be part of the substrate processing system 100 of FIG. 1. The dynamic load lock chamber 500 is positioned intermediate of the first chamber 205A and the second chamber 205B. In contrast to the previous embodiments where the axis of rotation A was horizontally oriented, the axis of rotation A is vertically oriented in this embodiment. The dynamic load lock chamber 500, as well as the first chamber 205A and the second chamber 205B may be part of the substrate processing system 100 of FIG. 1. The dynamic load lock chamber 500 may be utilized as one or more of the first dynamic load lock chamber 130, the second dynamic load lock chamber 160, and the third dynamic load lock chamber 190 of the substrate processing system 100 of FIG. 1. The first chamber 205A and the second chamber 205B may be utilized as one or more of the processing chambers 140, 150, 170 and 180 of the substrate processing system 100. Alternatively, one of the first chamber 205A and the second chamber 205B may be utilized as the substrate loading station 105 or the substrate unload chamber 195 of the substrate processing system 100 of FIG. 1.

In this embodiment, the dynamic load lock chamber 500 comprises a horizontally oriented carousel 505 disposed within the stationary housing 235. The stationary housing 235 is coupled to each of the first chamber 205A and the second chamber 205B adjacent a first opening 236A and an opposing second opening 236B, respectively, in a sidewall of the stationary housing 235. The carousel 505 rotates about an axis A similar to the embodiments of the dynamic load lock chambers 200, 300 and 400 except that the axis A is vertical (Z direction).

The dynamic load lock chamber 500 is similar to the dynamic load lock chamber 400 described in FIG. 4 with the following exceptions. In this embodiment, openings 510A-510H between each of the plurality of partitions 310 include a conveyor assembly 410. Each conveyor assembly 410 may be a roller arrangement having a continuous drive member, such as a belt or chain positioned thereover adapted to support a substrate. The conveyor assemblies 410 assist in transfer of substrates to and from the carousel 505. In the position shown in FIG. 5, the carousel 505 is positioned to transfer substrate 220B to conveyor 215B of the second chamber 205B. Each of the conveyor assemblies 410 may be coupled to a drive mechanism (not shown) that is selectively actuatable based on instructions from the controller 110 (shown in FIGS. 2A-2C). The conveyor assemblies 410 may be utilized to facilitate transfer of substrates by pulling incoming substrates through opening 236A and pushing substrates (such as substrate 220B) through opening 236B and onto the conveyor 215B of the second chamber 205B. The staged vacuum provided by the dynamic load lock chamber 500 may be lowering of pressure from ambient pressure ((e.g., about 760 Torr (about 101.3 kiloPascals)) to about 5 milliTorr (e.g., about 0.66 Pascals) to about 10 milliTorr (e.g., about 1.33 Pascals), or less, in a half revolution of the carousel 505.

Figure 6:
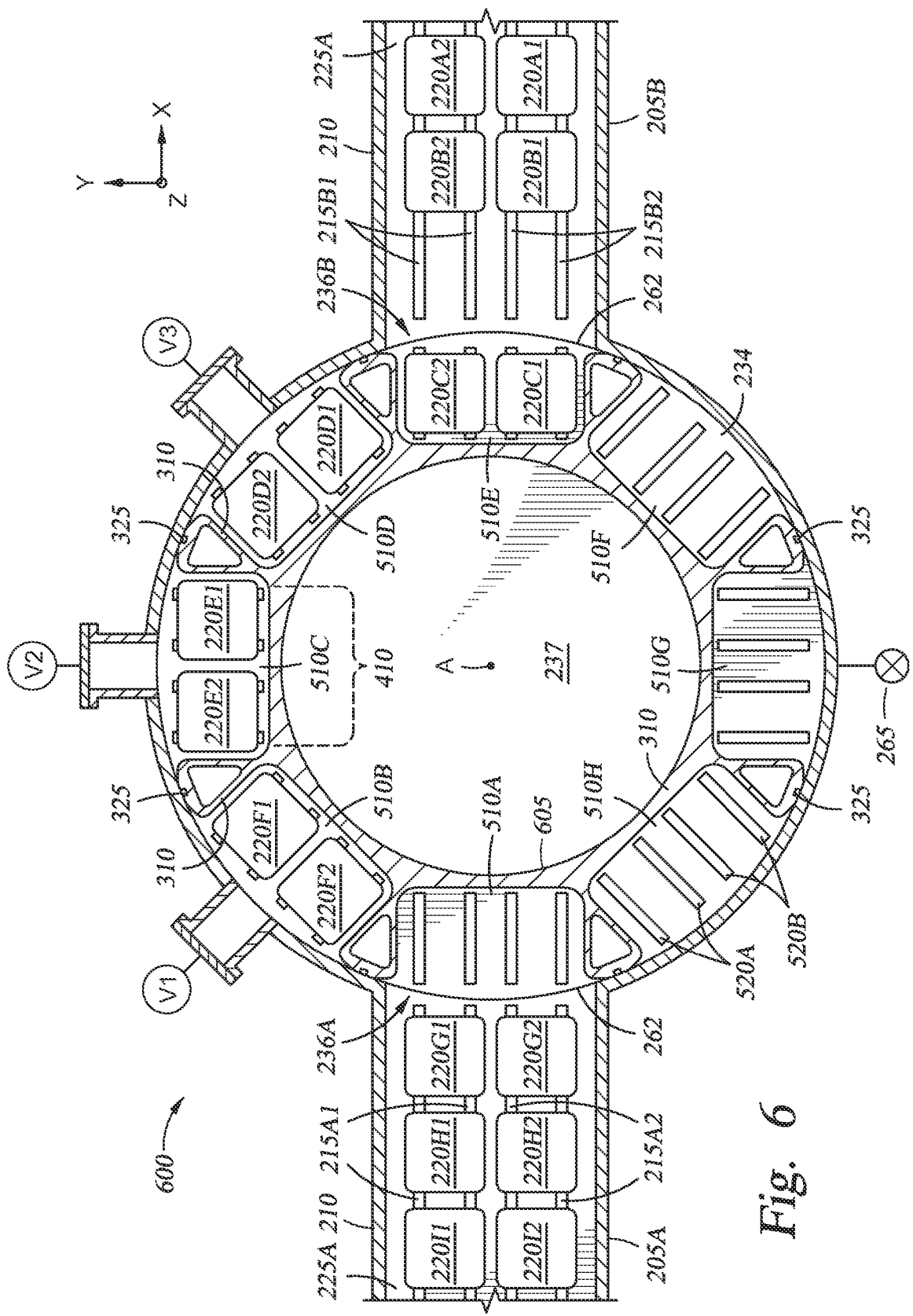
FIG. 6 is a schematic cross-sectional plan view of another embodiment of a dynamic load lock chamber that may be part of the substrate processing system of FIG. 1.

FIG. 6 is a schematic cross-sectional plan view of another embodiment of a dynamic load lock chamber 600 that may be part of the substrate processing system 100 of FIG. 1. The dynamic load lock chamber 600 is positioned intermediate of the first chamber 205A and the second chamber 205B. The dynamic load lock chamber 600, as well as the first chamber 205A and the second chamber 205B may be part of the substrate processing system 100 of FIG. 1. The dynamic load lock chamber 600 may be utilized as one or more of the first dynamic load lock chamber 130, the second dynamic load lock chamber 160, and the third dynamic load lock chamber 190 of the substrate processing system 100 of FIG. 1. The first chamber 205A and the second chamber 205B may be utilized as one or more of the processing chambers 140, 150, 170 and 180 of the substrate processing system 100. Alternatively, one of the first chamber 205A and the second chamber 205B may be utilized as the substrate loading station 105 or the substrate unload chamber 195 of the substrate processing system 100 of FIG. 1.

In this embodiment, the dynamic load lock chamber 600 comprises a horizontally oriented carousel 605 similar to the embodiments of the dynamic load lock chamber 500 described in FIG. 5 with the following exceptions. In this embodiment, openings 510A-510H between each of the plurality of partitions 310 include a dual conveyor assembly 515 having two conveyors 520A and 520B. Each of the conveyors 520A and 520B may be a roller arrangement having a continuous drive member, such as a belt or chain positioned thereover adapted to support a substrate. Likewise, each of the first chamber 205A and the second chamber 205B include dual conveyors 215A1, 215A2 and 215B1, 215B2. The dual conveyor assemblies 515 assist in transfer of substrates to and from the carousel 605. In the position shown in FIG. 6, the carousel 605 is positioned to transfer substrate 220C1 and 220C2 to conveyor 215B2 and conveyor 215B1, respectively, of the second chamber 205B. The other side of the carousel 605 is positioned to receive substrate 220G1 and 220G2 from the first chamber 205A via conveyor 215A1 and conveyor 215A2, respectively. Each of the conveyors 520A and 520B in each of the openings 510A-510H may be coupled to a dedicated or common drive mechanism (not shown) that is selectively actuatable based on instructions from the controller 110 (shown in FIGS. 2A-2C).

Various embodiments of a dynamic load lock chamber are provided which are capable of increasing throughput (e.g., handling substrates at a rate of greater than about 3,000 substrates per hour) by reducing cycle time. Additionally, less expensive vacuum pumps may be used to evacuate the discrete, reduced volume regions of the dynamic load lock chambers 300, 400, 500 and 600. While the dynamic load lock chambers 200, 300, 400, 500 and 600 have been described transferring substrates 200 in a clockwise direction to facilitate staged vacuum from a first higher pressure environment to a second lower pressure environment, the transfer direction of the dynamic load lock chambers 200, 300, 400, 500 and 600 may be reversed to transfer substrates 200 in a counterclockwise direction to facilitate a staged higher pressure regime from the second pressure environment to the first pressure environment (e.g., from vacuum to ambient pressure).

While the foregoing is directed to embodiments of the present invention, other and further embodiments of the invention may be devised without departing from the basic scope thereof, and the scope thereof is determined by the claims that follow.

The invention claimed is:

1. A load lock chamber, comprising:
a first circular housing; and
a second circular housing disposed within and movable relative to the first circular housing, the second circular housing comprising a plurality of slots defining a plurality of discrete regions, wherein the second movable housing comprises an n number of discrete regions, n being equal to or greater than 4, wherein n−2 of the plurality of discrete regions are positioned in a transfer region between a location of the first and the second chambers, each of the slots comprising a conveyor device for transfer of a substrate thereon, wherein at least a portion of the plurality of discrete regions are in selective fluid communication with one of at least two vacuum pumps coupled to the first circular housing based on the angular position of the second circular housing relative to the first circular housing providing a staged vacuum within the first circular housing, wherein each of the plurality of discrete regions comprise a partition coupled to a radially extending sidewall having the slot therebetween, and wherein the partition and the sidewalls contain a void therebetween.

2. The chamber of claim 1, wherein the second circular housing comprises a plurality of vacuum seals coupled thereto that are in sliding contact with a contact surface of the first circular housing.

3. The chamber of claim 1, wherein the conveyor device comprises a plurality of roller elements.

4. The chamber of claim 1, wherein each slot comprises two opposing conveyor devices in each slot that are adapted to receive a substrate therebetween, each conveyor device comprising a plurality of roller elements.

5. A load lock chamber, comprising:
a first stationary housing, a first chamber and a second chamber coupled to the first stationary housing at opposing sides thereof, and a plurality of vacuum pumps coupled to the first stationary housing at positions between the first chamber and the second chamber; and
a second movable housing disposed within a transfer region of the first stationary housing, wherein the second movable housing comprises a plurality of discrete regions each having a conveyor device disposed therein, wherein each conveyor device comprises a plurality of roller elements, and wherein at least a portion of the plurality of discrete regions are in selective fluid communication with at least one of the vacuum pumps based on the angular position of the second movable housing relative to the first stationary housing providing a staged vacuum within the first stationary housing, wherein each of the plurality of discrete regions comprise a partition coupled to a radially extending sidewall having a slot therebetween, wherein the partition and the sidewalls contain a void therebetween.

6. The chamber of claim 5, wherein the second movable housing comprises a plurality of vacuum seals coupled thereto that are in sliding contact with a contact surface of the first stationary housing.

7. The chamber of claim 5, wherein the conveyor device comprises two opposing sets of roller elements.

8. The chamber of claim 5, wherein each partition comprises a vacuum seal coupled thereto that is in sliding contact with the contact surface of the first stationary housing.

9. A load lock chamber, comprising:
a first circular housing; and
a second circular housing disposed within and movable relative to the first circular housing, the second circular housing comprising a plurality of partitions having slots formed between sidewalls attached to each partition, each partition and adjoining sidewall having a void formed therein, and each of the slots comprise a conveyor device for transfer of a substrate thereon, wherein at least a portion of the slots are in selective fluid communication with one of at least two vacuum pumps based on the angular position of the second circular housing relative to the first circular housing.

10. The chamber of claim 9, wherein each partition comprises a vacuum seal coupled thereto that is in sliding contact with a contact surface of the first circular housing.

11. The chamber of claim 9, wherein the conveyor device comprises a plurality of roller elements.

12. The chamber of claim 11, wherein the conveyor device comprises roller elements positioned on opposing sides of each slot.

* * * * *